(12) United States Patent
Katou et al.

(10) Patent No.: US 11,127,854 B2
(45) Date of Patent: Sep. 21, 2021

(54) SEMICONDUCTOR DEVICE AND METHOD OF MANUFACTURING SAME

(71) Applicants: Kabushiki Kaisha Toshiba, Tokyo (JP); Toshiba Electronic Devices & Storage Corporation, Tokyo (JP)

(72) Inventors: Hiroaki Katou, Nonoichi Ishikawa (JP); Atsuro Inada, Nonoichi Ishikawa (JP); Tatsuya Shiraishi, Nonoichi Ishikawa (JP); Tatsuya Nishiwaki, Komatsu Ishikawa (JP); Kenya Kobayashi, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/810,271

(22) Filed: Mar. 5, 2020

(65) Prior Publication Data
US 2021/0074848 A1    Mar. 11, 2021

(30) Foreign Application Priority Data
Sep. 5, 2019   (JP) .............................. JP2019-162275

(51) Int. Cl.
*H01L 29/78*    (2006.01)
*H01L 29/423*   (2006.01)
*H01L 29/08*    (2006.01)

(52) U.S. Cl.
CPC ...... *H01L 29/7813* (2013.01); *H01L 29/0878* (2013.01); *H01L 29/4238* (2013.01); *H01L 29/42368* (2013.01)

(58) Field of Classification Search
CPC ............. H01L 29/7813; H01L 29/0878; H01L 29/42368; H01L 29/4238; H01L 29/7827
See application file for complete search history.

(56) References Cited

U.S. PATENT DOCUMENTS 7,696,599 B2   4/2010  Hueting et al.
7,816,756 B2   10/2010 Saito
(Continued)

FOREIGN PATENT DOCUMENTS

| JP | 2007-512701 A | 5/2007 |
| JP | 2007-281034 A | 10/2007 |
| JP | 5580150 B2    | 8/2014 |

*Primary Examiner* — Douglas W Owens
(74) *Attorney, Agent, or Firm* — White & Case LLP (57) ABSTRACT

A semiconductor device includes a semiconductor part, an first electrode, a control electrode and second electrodes. The control electrode and the second electrodes are provided between the semiconductor part and the first electrode, and provided inside trenches, respectively. The second electrodes include first to third ones. The first and second ones of the second electrodes are adjacent to each other with a portion of the semiconductor part interposed. The second electrodes each are electrically isolated from the semiconductor part by a insulating film including first and second insulating portions adjacent to each other. The first insulating portion has a first thickness. The second insulating portion has a second thickness thinner than the first thickness. The first insulating portion is provided between the first and second ones of the second electrodes. The second insulating portion is provided between the first and third ones of the second electrodes.

12 Claims, 12 Drawing Sheets

(56) References Cited

U.S. PATENT DOCUMENTS

| | | |
|---|---|---|
| 8,629,505 B2 | 1/2014 | Nishiwaki |
| 2021/0074848 A1* | 3/2021 | Katou ................. H01L 29/0696 |

* cited by examiner

SEMICONDUCTOR DEVICE AND METHOD OF MANUFACTURING SAME

CROSS-REFERENCE TO RELATED APPLICATIONS

This application is based upon and claims the benefit of priority from Japanese Patent Application No. 2019-162275, filed on Sep. 5, 2019; the entire contents of which are incorporated herein by reference.

FIELD

Embodiments relate generally to a semiconductor device and a method of manufacturing the same.

BACKGROUND

Power semiconductor devices are required to have characteristics such as high breakdown voltage and low ON resistance. For example, a trench gate type MOSFET includes a semiconductor layer with a high impurity concentration, which provides the low ON resistance, and a field plate provided inside the trench to achieve the high breakdown voltage by controlling the electric field distribution in the semiconductor layer.

BRIEF DESCRIPTION OF THE DRAWINGS

FIG. 6A to FIG. 10C are schematic views showing a manufacturing process of the semiconductor device according to the embodiment;

DETAILED DESCRIPTION

According to one embodiment, a semiconductor device includes the semiconductor part, a first electrode, a control electrode and a plurality of second electrodes. The semiconductor part includes a first semiconductor layer of a first conductivity type. The semiconductor part has a first trench and a plurality of second trenches. The first trench and the plurality of second trenches are provided at a front surface side of the semiconductor part. The first trench and the plurality of second trenches extend into the first semiconductor layer. The first electrode is provided on the front surface of the semiconductor part. The control electrode is provided between the semiconductor part and the first electrode. The control electrode is provided inside the first trench, and electrically isolated from the semiconductor part by a first insulating film. The control electrode is electrically isolated from the first electrode by a second insulating film. The plurality of second electrodes are provided between the semiconductor part and the first electrode. The plurality of second electrodes are provided inside the plurality of second trenches, respectively. The plurality of second electrodes each are electrically isolated from the semiconductor part by a third insulating film, and electrically connected to the first electrode. The semiconductor part further includes a second semiconductor layer of a second conductivity type and a third semiconductor layer of the first conductivity type. The second semiconductor layer is provided between the first semiconductor layer and the first electrode, and faces the control electrode with the first insulating film interposed. The third semiconductor layer is selectively provided between the second semiconductor layer and the first electrode. The third semiconductor layer is provided to contact the first insulating film. The third semiconductor layer is electrically connected to the first electrode. The plurality of second electrodes include first to third ones. The first and second ones of the second electrodes are adjacent to each other with a portion of the semiconductor part interposed. The third insulating film is provided between the first one of the second electrodes and the first semiconductor layer, and includes a first insulating portion and the second insulating portion. The second insulating portion is adjacent to the first insulating portion. The first insulating portion has a first thickness in a direction toward the first semiconductor layer from the first one of the second electrodes. The second insulating portion has a second thickness in a direction toward the first semiconductor layer from the first one of the second electrodes. The second thickness is thinner than the first thickness. The first insulating portion is provided between the first and second ones of the second electrodes. The second insulating portion is provided between the first and third ones of the second electrodes.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1A:
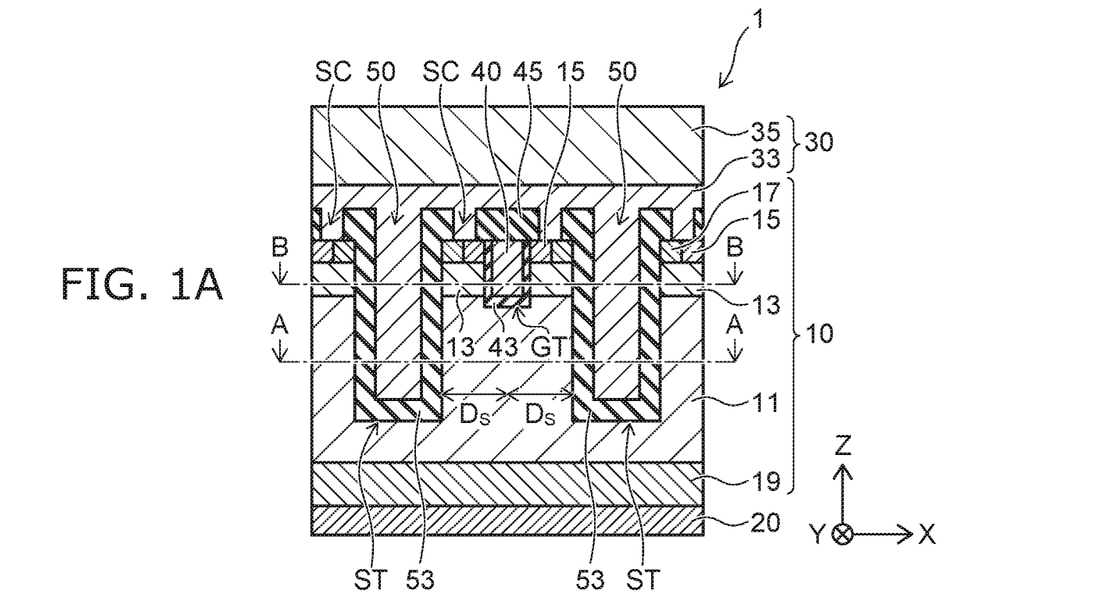
FIGS. 1A and 1B are schematic views showing a semiconductor device according to an embodiment.
Figure 1B:
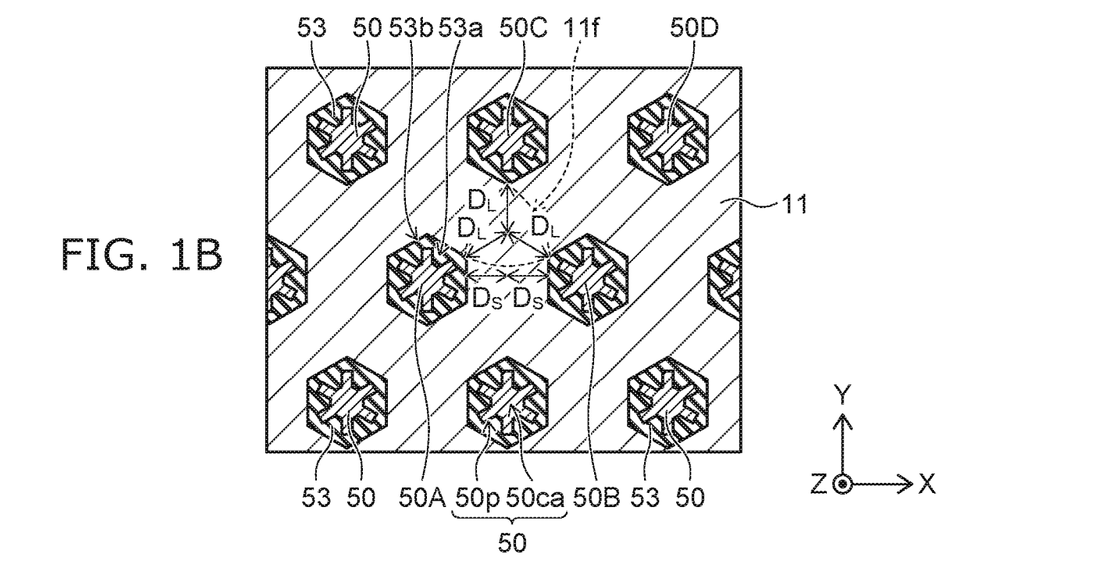

FIGS. 1A and 1B are schematic views showing a semiconductor device 1 according to an embodiment. FIG. 1A is a schematic cross-sectional view showing the semiconductor device 1. FIG. 1B is a schematic view showing a cross-section along A-A line shown in FIG. 1A. The semiconductor device 1 is, for example, a MOSFET.

As shown in FIG. 1A, the semiconductor device 1 includes a semiconductor part 10, a drain electrode 20, a source electrode 30, a gate electrode 40, and a field electrode 50 (hereinafter, FE50). The FE 50 provides a desired electric field distribution in the semiconductor part 10. The drain electrode 20 is provided at a back-surface side of the semiconductor part 10. The source electrode 30 is provided at a front surface side of the semiconductor part 10.

The semiconductor part 10 is, for example, silicon. The semiconductor part 10 includes an n-type drift layer 11, a p-type diffusion layer 13, an n-type source layer 15, a p-type contact layer 17 and an n-type drain layer 19.

The n-type drift layer 11 extends, for example, in the X-direction and the Y-direction between the drain electrode 20 and the source electrode 30, and extends in the entire semiconductor part 10. The p-type diffusion layer 13 is provided between the n-type drift layer 11 and the source electrode 30.

The n-type source layer 15 is selectively provided between the p-type diffusion layer 13 and the source electrode 30. The n-type source layer 15 includes an n-type impurity with a concentration higher than a concentration of an n-type impurity in the n-type drift layer 11.

The p-type contact layer 17 is selectively provided between the p-type diffusion layer 13 and the source electrode 30. The p-type contact layer 17 includes a p-type impurity with a concentration higher than a concentration of a p-type impurity in the p-type diffusion layer 13.

The n-type drain layer 19 is provided between the n-type drift layer 11 and the drain electrode 20. The n-type drain layer 19 includes a n-type impurity with a concentration higher than the concentration of the n-type impurity in the n-type drift layer 11. The drain electrode 20 is in contact with, for example, the n-type drain layer 19 and is electrically connected thereto, The gate electrode 40 and the FE 50 are provided between semiconductor part 10 and source electrode 30. The gate electrode 40 is provided in a gate trench GT. The FE 50 is provided in a source trench ST.

The gate trench GT and the source trench ST have a depth extend into the n-type drift layer 11 from the front surface of semiconductor part 10. The gate trench GT and the source trench ST have, for example, the bottoms positioned in the n-type drift layer 11. The bottom of the source trench ST is provided at a level deeper than the bottom of the gate trench GT.

The gate electrode 40 is electrically isolated from the semiconductor part 10 by the gate insulating film 43. The gate electrode 40 is electrically isolated from the source electrode 30 by an interlayer insulating film 45. The p-type diffusion layer 13 faces the gate electrode 40 via the gate insulating film 43. The n-type source layer 15 is provided to be in contact with the gate insulating film 43, and extends along the gate electrode 40.

The FE 50 is electrically isolated from the semiconductor part 10 by an insulating film 53, The FE 50 is electrically connected to the source electrode 30. In this example, the FE 50 is provided together with the source electrode 30, but may be separated from the source electrode 30.

The semiconductor device 1 includes a plurality of FEs 50. Each FE 50 is provided with a columnar body extending in the depth direction (i.e., Z-direction) of the source trench ST. The FE 50 is provided to have a lower end positioned at a level deeper than a lower end of the gate electrode 40. That is, the distance from the lower end of the FE 50 to the n-type drain layer 19 is shorter than the distance from the lower end of the gate electrode 40 to the n-type drain layer 19.

As shown in FIG. 1B, the plurality of FEs 50 are provided, for example, in so-called a staggered arrangement, in which the FEs 50 are arranged in lines along the X-direction and shifted in every other line along the X-direction with the half cycle of the arrangement. The source trench ST has a cross-section of, for example, a hexagonal shape.

The FE 50 includes, for example, a core 50ca extending in the Z-direction and a protrusion 50p protruding from the core 50ca at the side surface thereof. The core 50ca is provided, for example, at the center of the hexagonal source trench ST, and the protrusion 50p extends, for example, toward a corner of the hexagon. The protrusion 50p also extends in the Z-direction along the side surface of the core 50ca. In this example, the FE 50 has six protrusions 50p around the core 50ca.

The insulating film 53 is provided between the n-type drift layer 11 and the FE 50. The insulating film 53 includes a first insulating portion 53a and a second insulating portion 53b. The second insulating portion 53b is thinner than the first insulating portion 53a. That is, in a direction from the center of the FE 50 toward the n-type drift layer 11, a thickness of the second insulating portion 53b is smaller than a thickness of the first insulating portion 53a. The first insulating portion 53a and the second insulating portion 53b are adjacent to each other and alternately provided along the side surface of the FE 50. The protrusion 50p of the FE 50 protrudes toward the second insulating portion 53b. For example, the protrusion 50p protrudes toward the corner of the hexagon, and the second insulating portion 53b is provided between the corner of the hexagon and the tip of the protrusion 50p.

When the semiconductor device 1 is, for example, in the OFF state of the switching operation, the depletion region is induced in the n-type drift layer 11. "$D_S$" and "$D_L$" shown in FIG. 1B indicate the widths of the depletion region due to the potential difference between the FE 50 and the drain electrode 20. For example, when the n-type drift layer 11 is entirely depleted between the FEs 50, "$D_S$" and "$D_L$" represent the width of the depletion region extending into the n-type drift layer 11 from the interface between the n-type drift layer 11 and the insulating film 53.

In the example, FEs 50A, 50B and 50C are shown in FIG. 1B, which are provided at the positions closest to each other. The FE 50A, the FE 50B, and the FE 50C are provided such that the centers thereof are positioned at vertices of equilateral triangle (not shown), respectively. The centers of the FE 50A, the FE 50C, the FE 50D and the other three FE 50 surrounding the FE 50B are positioned at vertices of regular hexagon (not shown), and the center of FE 50B is positioned at the center of regular hexagon.

For example, "$D_S$" is the width of the depletion region extending between the FE 50A and the FE 50B. When viewed from the FE 50A, the FE 50D is provided at the position farther than the positions of the FE 50B and the FE 50C. "$D_L$" is, for example, the width of the depletion layer extending in the direction from the FE 50A to the FE 50D. The depletion layer width $D_L$ is larger than the depletion layer width $D_S$ ($D_L > D_S$). That is, in the region 11f surrounded by the FE 50A, the FE 50B and the FE50C, the depletion region width $D_L$ toward the center of the region 11f is larger than the depletion region width $D_S$ between the FE 50A and the FE 50B.

For example, when increasing the concentration of the n-type impurity in the n-type drift layer 11 to reduce the ON resistance of the semiconductor device 1, the extension of the depletion region is suppressed in the n-type drift layer 11. Thus, the non-depleted portion remains in the n-type drift layer 11, thereby reducing the breakdown voltage of the semiconductor device 1.

In the semiconductor device 1 according to the embodiment, for example, the first insulating portion 53a of the insulating film 53 is provided between the FE 50A and the FE 50B, which are placed closest to each other, and the second insulating portion 53b is provided between the FE 50A and the FE 50D. Thereby, it is possible to make the electric field strength higher at the interface between the n-type drift layer 11 and the second insulating portion 53b than the electric field strength at the interface between the n-type drift layer 11 and the first insulating portion 53a. Then, the extension of the depletion region is facilitated in the direction toward the center of the region 11f surrounded by the FE 50A, the FE 50B, and the FE 50C (i.e., the direction in which the depletion layer width $D_L$ is defined). That is, it is possible to increase the concentration of the n-type impurity in the n-type drift layer 11 without the non-depleted portion remaining in the n-type drift layer 11. Thus, the ON resistance is reduced while maintaining the breakdown voltage of the semiconductor device 1.

Figure 2:
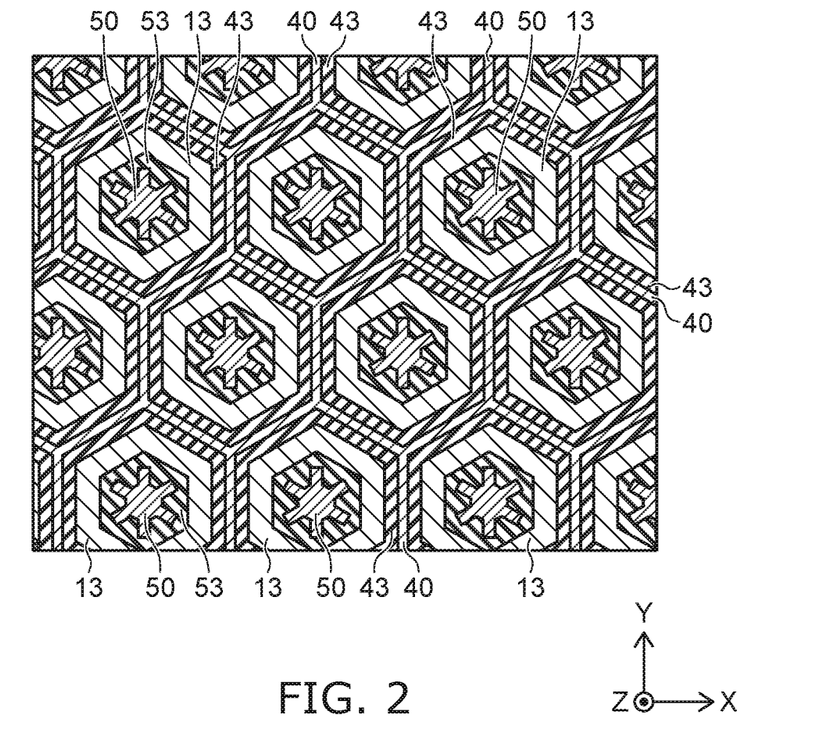
FIG. 2 is a schematic plan view showing the semiconductor device according to the embodiment.

FIG. 2 is a schematic plan view showing the semiconductor device 1 according to the embodiment. FIG. 2 is a schematic view showing a cross section along the line B-B shown in FIG. 1B. FIG. 2 illustrates the arrangement of gate electrodes 40.

As shown in FIG. 2, the gate electrode 40 is integrally provided between adjacent FEs 50. The gate electrode is provided to surround each of the plurality of FEs 50.

FIGS. 3A to 4B are schematic plan views showing semiconductor devices 2 to 5 according to modifications of the embodiment. FIGS. 3A to 4B are schematic views showing the cross sections corresponding to the cross section taken along the A-A line shown in FIG. 1A.

Figure 3A:
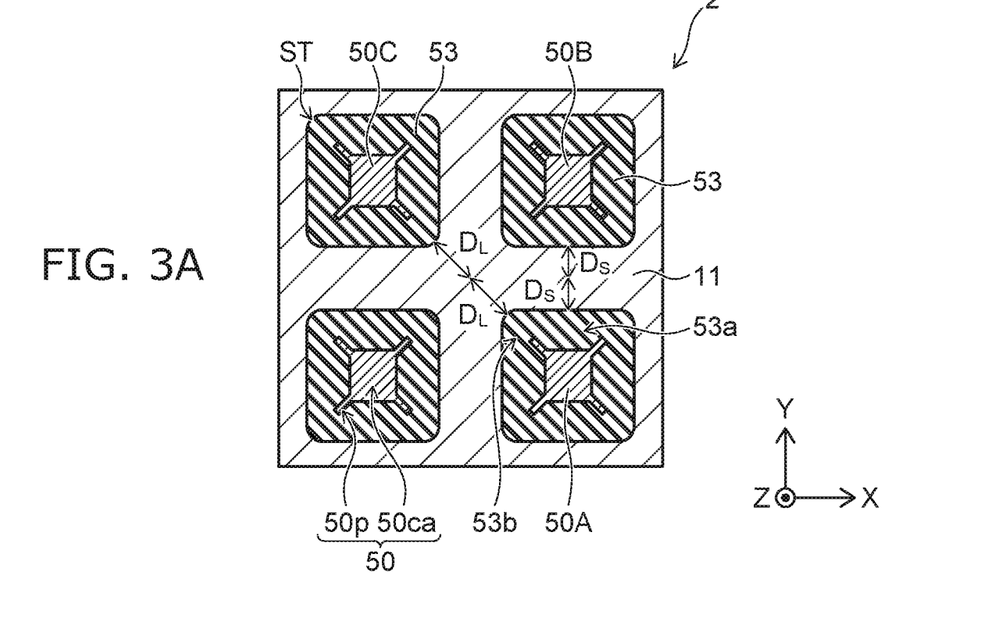
FIGS. 3A and 3B are schematic plan views showing semiconductor devices according to modifications of the embodiment.
Figure 3B:
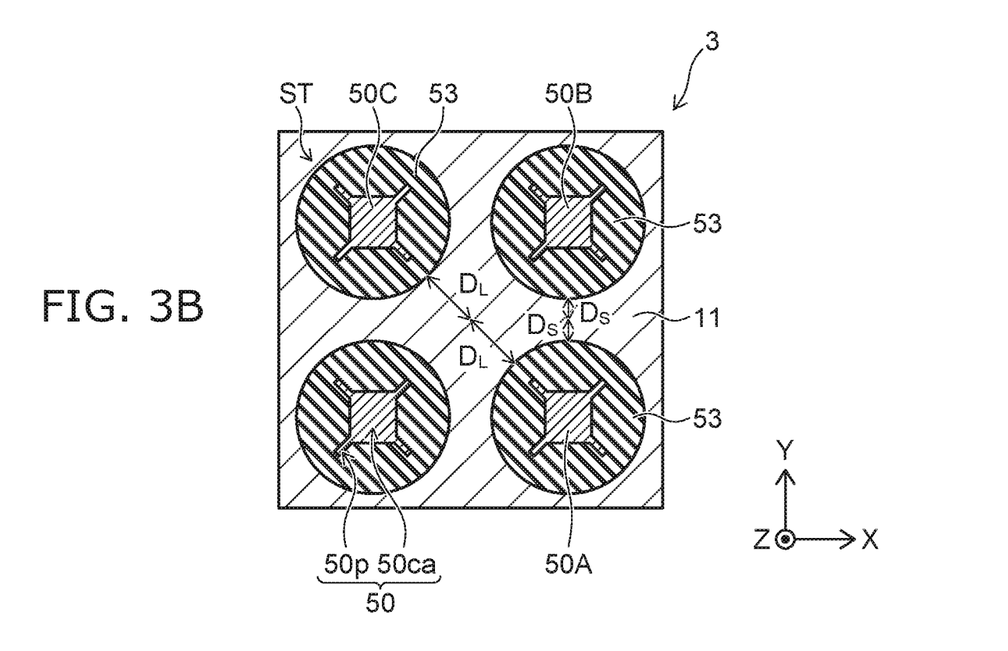

As shown in FIGS. 3A and 3B, the FEs 50 may be arranged, for example, in the X-direction and the Y-direction. In this case, each FE 50 includes the four protrusions. The source trench ST may have a cross-section of, for example, square or circle.

For example, the FE 50A and the FE 50B are placed closest to each other. The FE 50A and the FE 50C is arranged in a diagonal direction. The FE 50C is farther than the FE 50B when viewed from the FE 50A, In the arrangement of four FEs 50, the depletion region extends in the diagonal direction with the width $D_L$ that is wider than the depletion region width $D_S$ between the FEs 50 closest to each other.

One of the four protrusions 50p of the FE 50A protrudes toward the FE 50C. That is, the protrusion 50p of the FE 50 protrudes in the diagonal direction. The first insulating portion 53a of the insulating film 53 is provided, for example, between the FE 50A and the FE 50B. The second insulating portion 53b is provided, for example, between the FE 50A and the FE 50C. Thereby, it is possible in the n-type drift layer 11 to facilitate the extension of the depletion region in the diagonal direction, Thus, the semiconductor devices 2 and 3 may have the characteristics of high breakdown voltage and low ON resistance.

Figure 4A:
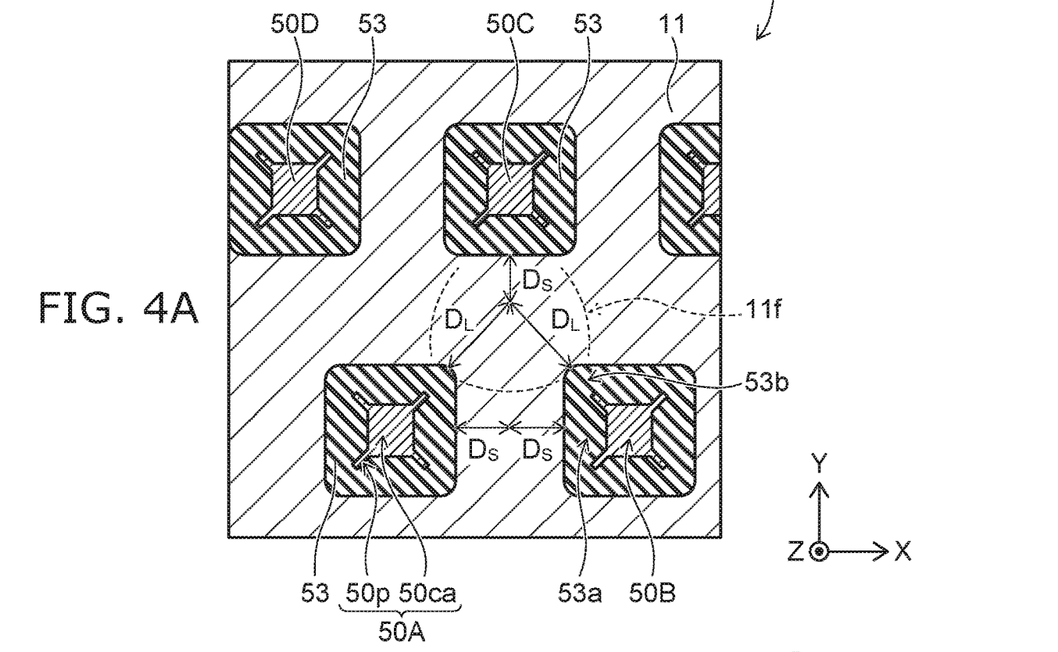
FIGS. 4A and 4B are schematic plan views showing semiconductor devices according to other modifications of the embodiment.
Figure 4B:
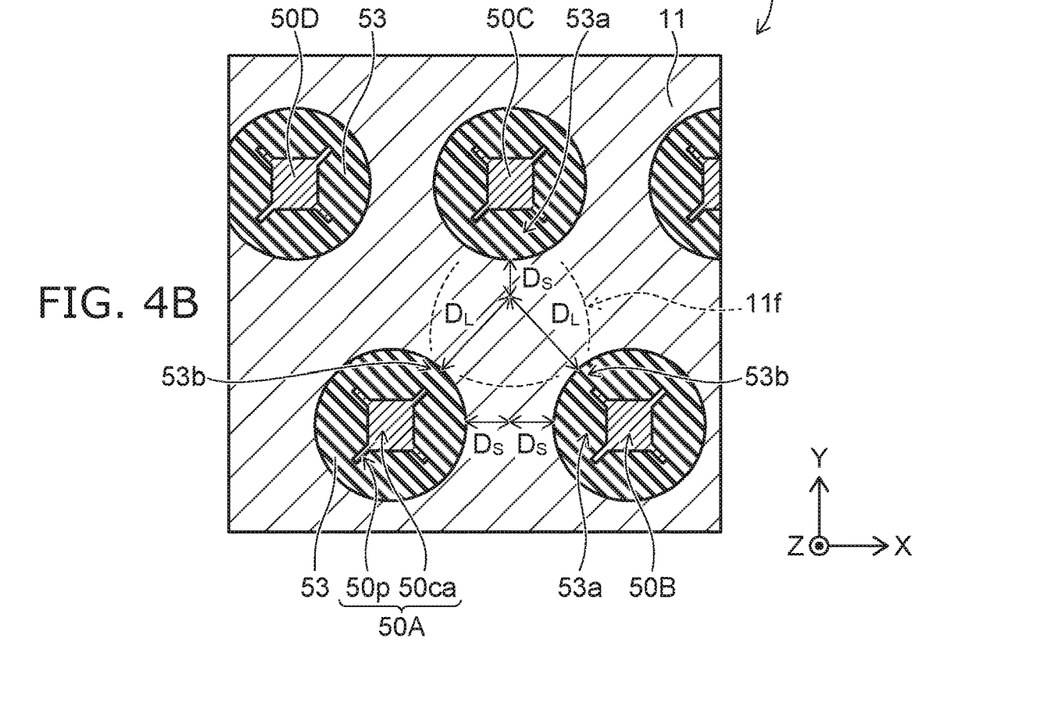

In the semiconductor devices 4 and 5 shown in FIGS. 4A and 4B, the plurality of FEs 50 are provided, for example, with the staggered arrangement. The source trench ST may have of, for example, a square or circular cross-section, In this example, each FE 50 includes the four protrusions 50p. The FE 50A, the FE 50B, and the FE 50C are provided at the positions closest to each other. The FE 50D is farther than the FE 50A and the FE 50C when viewed from the FE 50B.

The first insulating portion 53a of the insulating film 53 is provided, for example, between the FE 50A and the FE 50B which are closest to each other. One of the four protrusions 50p of the FE 50B is provided to protrude toward the FE 50D, for example. Thus, the second insulating portion 53b is provided, for example, between the FE 50B and the FE 50D.

The depletion region is facilitated to extend in the region 11f of the n-type drift layer 11 that is surrounded by the FE 50A, the FE 50B and the FE 50C by the electric field at the interface between the n-type drift layer 11 and the second insulating portion 53b. In other words, the depletion region extends into the region 11f with the width $D_L$ from the source trenches ST that include the FE 50A and the FE 50B, and the width $D_L$ is wider than the width $D_S$ of the depletion region that extends into the region 11f from the source trench ST including the FE 50C. That is, the extensions of the depletion region from the source trenches ST that include the FE 50A and the FE 50B are facilitated. Thereby, it is possible to deplete the whole of the region 11f when the n-type drift layer 11 is provided with the higher n-type impurity concentration.

Figure 5A:
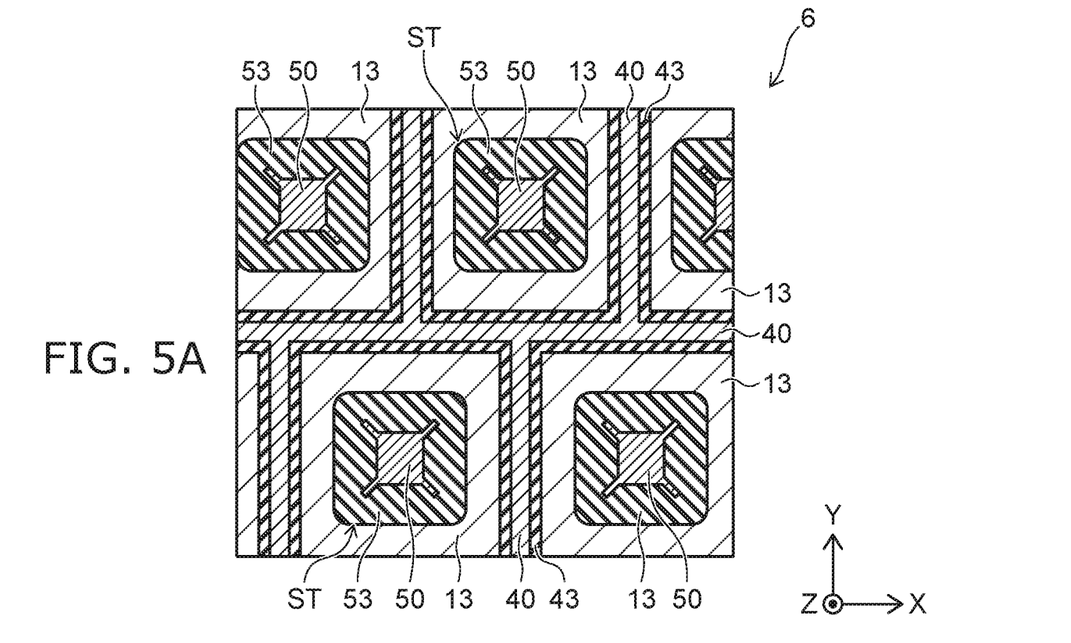
FIGS. 5A and 5B are schematic plan views showing semiconductor devices according to other modifications of the embodiment.
Figure 5B:
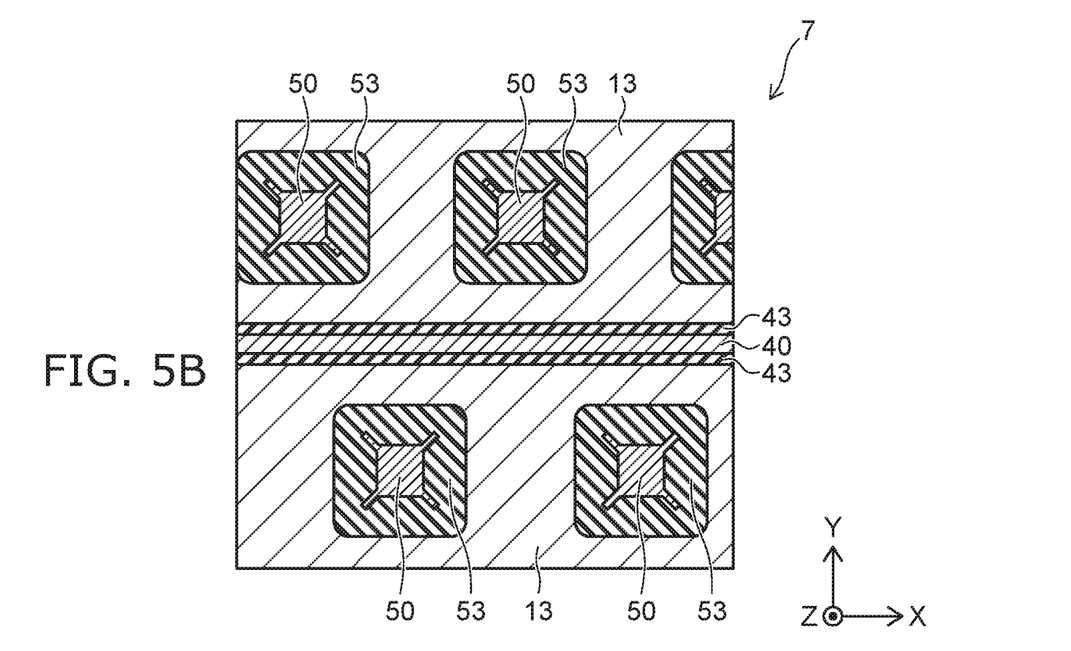

FIGS. 5A and 5B are schematic plan views showing semiconductor devices 6 and 7 according to modifications of the embodiment. FIGS. 5A and 5B are schematic views showing a cross section corresponding to the cross section taken along B-B line shown in FIG. 1A.

As shown in FIG. 5A, the FEs 50 are provided with, for example, the staggered arrangement. The gate electrode 40 is provided between the FEs 50 closest to each other. The gate electrode 40 is provided to surround each source trench ST in which the FE 50 is provided (see FIG. 2).

The arrangement of the gate electrode 40 is not limited to the example shown in FIG. 5A. For example, as shown in FIG. 5B, the gate electrode may extend in one direction (e.g., the X-direction) without branching, and may be provided between the FEs 50 closest to each other.

Hereinafter, with reference to FIGS. 6A to 10C, a manufacturing method of the semiconductor device 1 will be described. FIGS. 6A to 10C are schematic views showing the manufacturing process of the semiconductor device 1 according to the embodiment. FIG. 9B is a schematic plan view, and the other figures are schematic cross-sectional views corresponding to FIG. 1A.

Figure 6A:
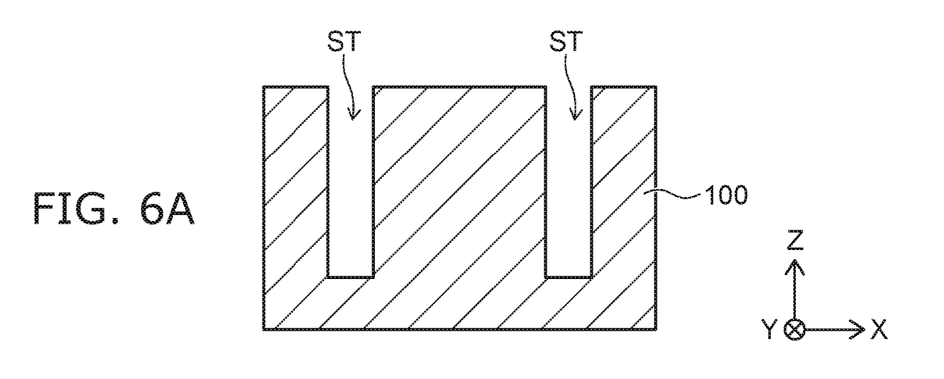

As shown in FIG. 6A, a plurality of source trenches ST are formed at the front surface side of the n-type semiconductor layer 100. The n-type semiconductor layer 100 is, for example, an n-type silicon layer epitaxially grown on an n-type silicon substrate and provided with a low impurity concentration. Alternately, the n-type semiconductor layer 100 may be a part of the n-type silicon wafer that includes the n-type impurity with a low concentration. The source trench ST is formed by, for example, anisotropic RIE (Reactive Ion Etching).

Figure 6B:
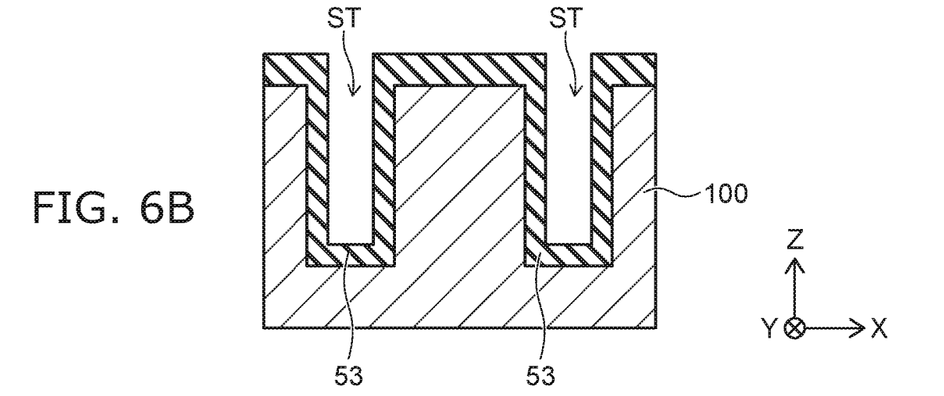

As shown in FIG. 6B, the insulating film 53 is formed to cover the front surface of the n-type semiconductor layer 100 and the inside of the source trench ST. The insulating film 53 is, for example, a silicon oxide film formed by thermally oxidizing the n-type semiconductor layer 100. The insulating film 53 is formed with a thickness leaving a space inside the source trench ST. The method of forming the insulating film 53 is not limited to the thermal oxidation, and the insulating film 53 may be formed by, for example, CVD (Chemical Vapor Deposition), or by a combination of the thermal oxidation and CVD.

Figure 6C:
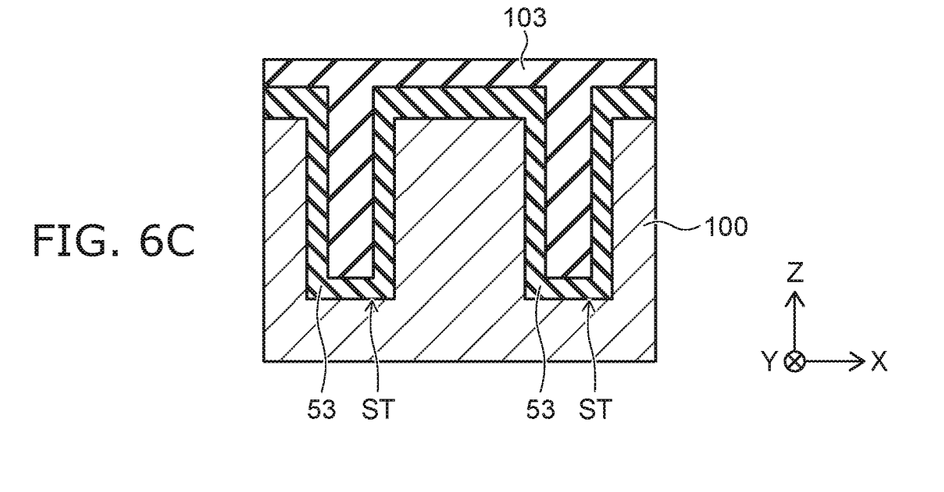

As shown in FIG. 6C, an insulating film 103 is formed to cover the insulating film 53 and fill the space inside the source trench ST. The insulating film 103 is, for example, a silicon oxide film formed by CVD.

Figure 7A:
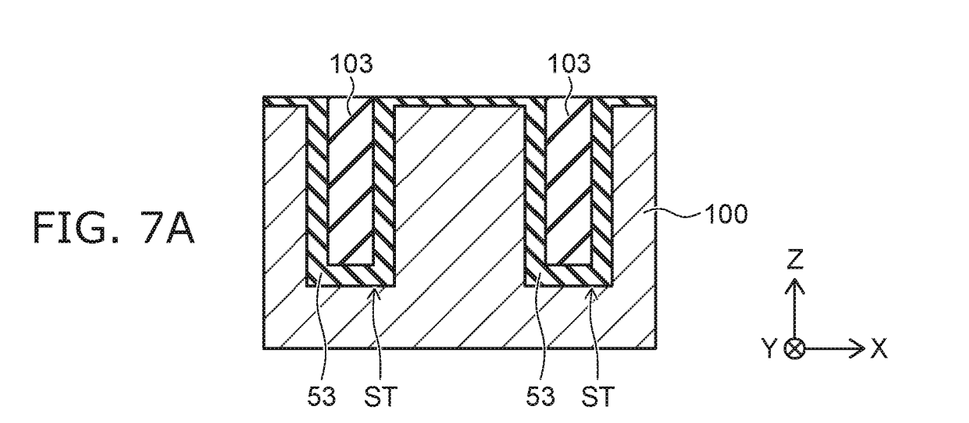

As shown in FIG. 7A, the insulating film 103 that is formed on the front surface of the n-type semiconductor layer 100 is removed so that the portion thereof remains inside the source trench ST. Then, the insulating film 53 is thinned, for example, which is formed on the front surface of the n-type semiconductor layer 100.

Figure 7B:
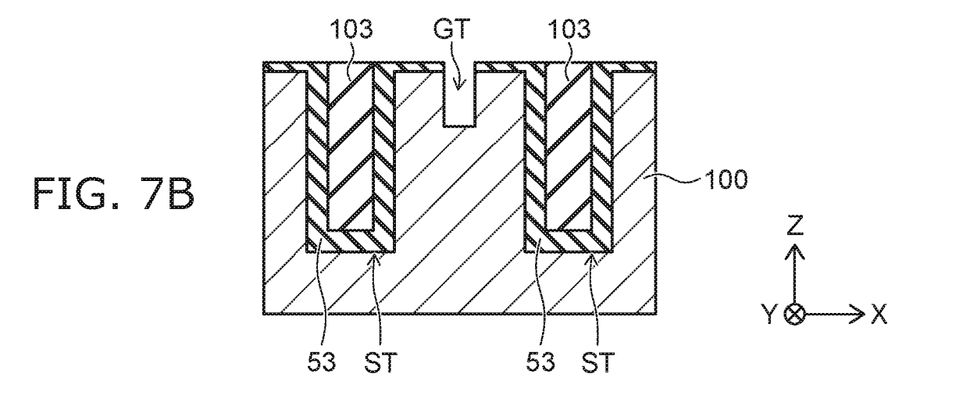

As shown in FIG. 7B, the gate trench GT is formed at the front surface side of the n-type semiconductor layer 100. The gate trench GT is formed between the adjacent source trenches ST. The gate trench GT has a depth from the front surface of the n-type semiconductor layer 100, and the depth of the gate trench is shallower than the depth of the source trench ST from the front surface of the n-type semiconductor layer 100. The gate trench GT is formed using, for example, anisotropic RIE.

Figure 7C:
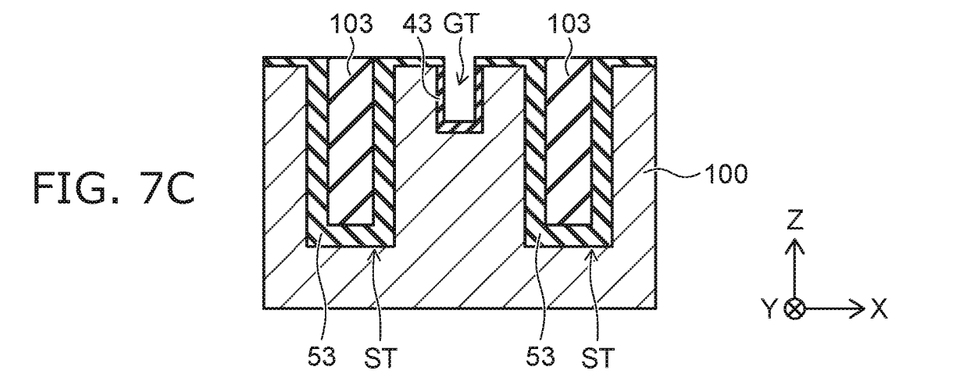

As shown in FIG. 7C, the gate insulating film 43 is formed to cover the inner surface of the gate trench GT. The gate insulating film 43 is, for example, a silicon oxide film formed by thermally oxidizing the n-type semiconductor layer 100. The gate insulating film 43 is formed with a thickness leaving a space inside the gate trench GT.

Figure 8A:
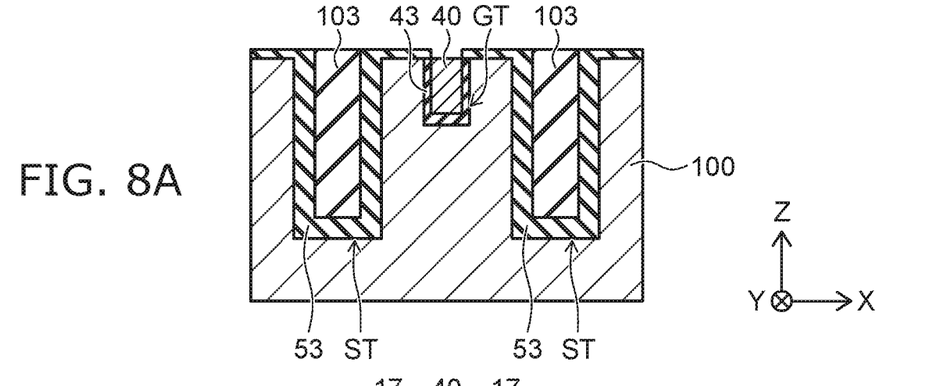

As shown in FIG. 8A, the gate electrode 40 is formed inside the gate trench GT. The gate electrode 40 is, for example, a conductive polysilicon. The gate electrode 40 is formed by, for example, forming a polysilicon layer (not shown) to fill the inside of the gate trench GT, and then etching back the polysilicon layer leaving the portion thereof so that the inside of the gate trench GT is filled with the portion thereof.

Figure 8B:
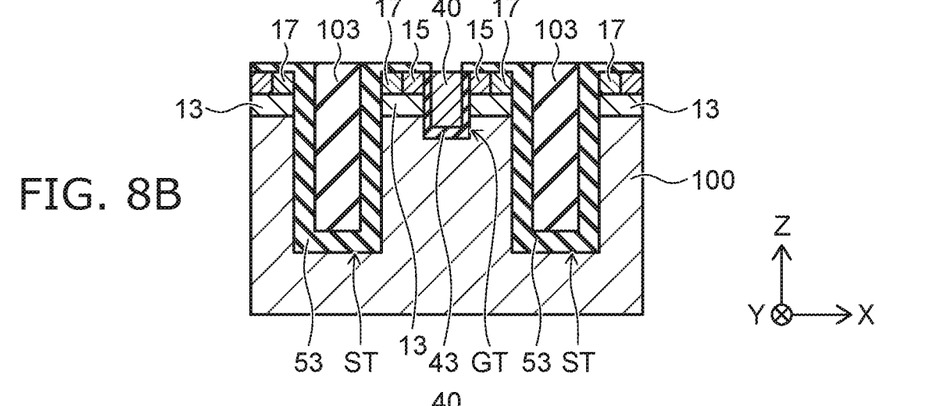

As shown in FIG. 8B, the p-type diffusion layer 13, the n-type source layer 15 and the p-type contact layer 17 are formed at the front surface side of the n-type semiconductor layer 100. The p-type diffusion layer 13 is formed by ion-implanting a p-type impurity such as boron (B) at the front surface side of the n-type semiconductor layer 100, and then activating and diffusing the p-type impurity by heat treatment. The p-type diffusion layer 13 is formed such that the bottom surface thereof is positioned at a level shallower than the lower end of the gate electrode 40. The p-type diffusion layer 13 includes the p-type impurity with a concentration higher than the concentration of the n-type impurity in the n-type semiconductor layer 100.

The n-type source layer 15 is formed by ion-implanting an n-type impurity such as phosphorus (P) at the front surface side of the n-type semiconductor layer 100 and activating the n-type impurity by heat treatment. The n-type source layer 15 is formed such that the bottom surface thereof is positioned at a level shallower than the bottom surface of p-type diffusion layer 13. The n-type source layer 15 is selectively formed to be in contact with the gate insulating film 43. The n-type source layer 15 includes the n-type impurity with a concentration higher than the concentration of the p-type impurity in the p-type diffusion layer 13.

The p-type contact layer 17 is formed by ion-implanting a p-type impurity such as boron (B) at the front surface side of the n-type semiconductor layer 100 and activating the p-type impurity by heat treatment. The p-type contact layer 17 is formed such that the bottom surface is located at a level shallower than the bottom surface of the p-type diffusion layer 13. The p-type contact layer 17 is selectively formed, for example, to be in contact with the insulating film 53. The p-type contact layer 17 includes the p-type impurity with a concentration higher than the concentration of the p-type impurity in the p-type diffusion layer 13.

Figure 8C:
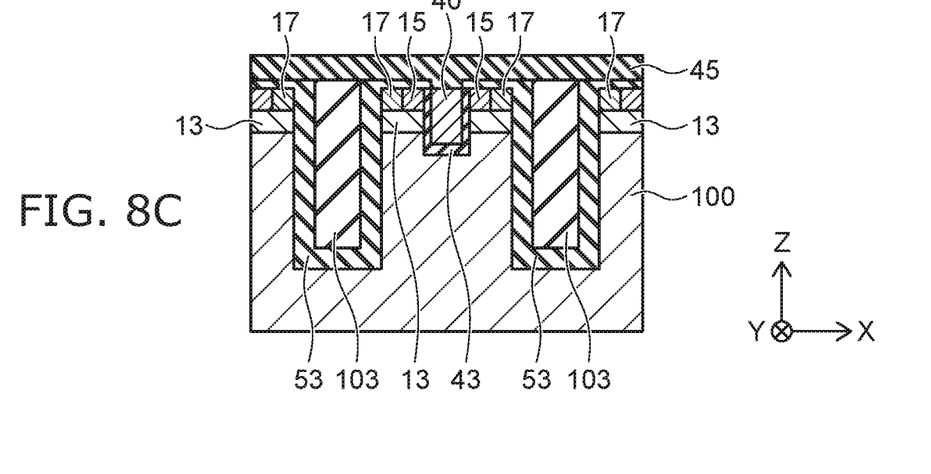

As shown in FIG. 8C, the interlayer insulating film 45 is formed to cover the upper end of the gate electrode 40. The interlayer insulating film 45 is, for example, a silicon oxide film formed by CVD. The interlayer insulating film 45 also covers the insulating films 53 and 103.

Figure 9A:
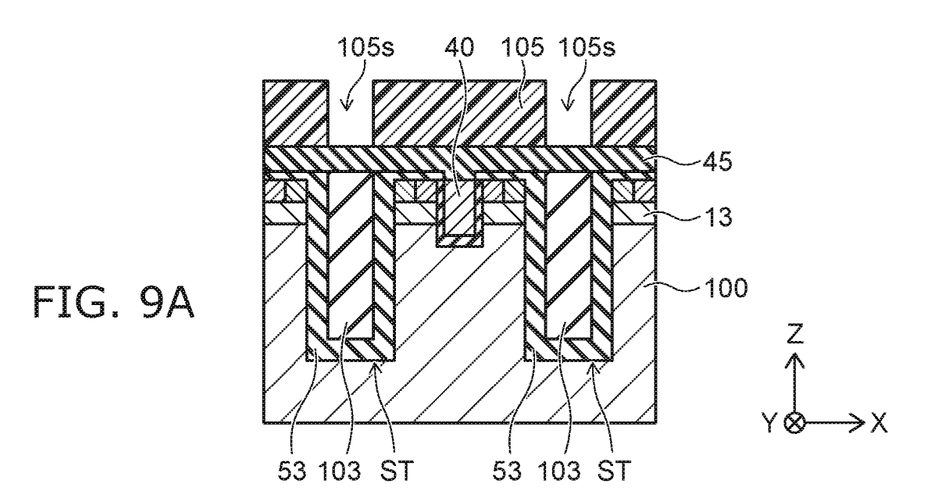
Figure 9B:
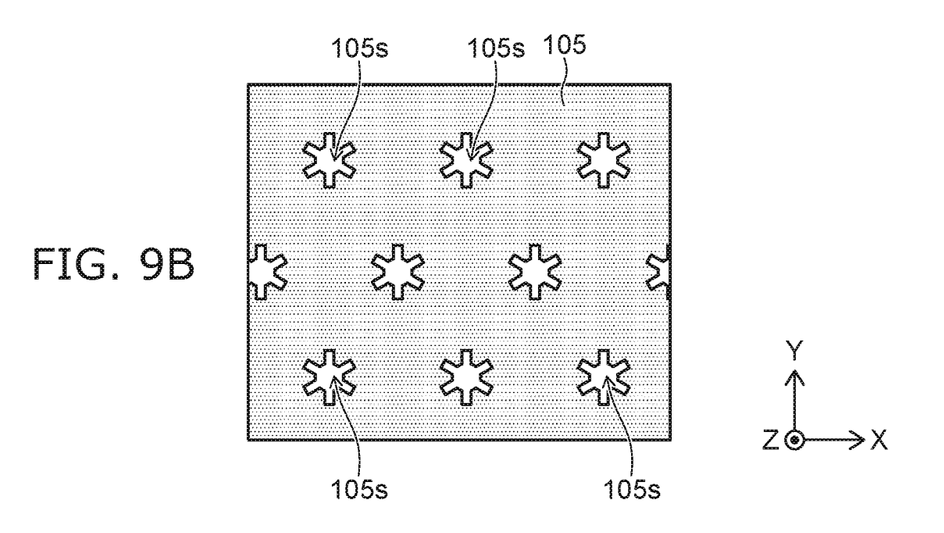

As shown in FIG. 9A, a resist mask is formed to cover the interlayer insulating film 45. The resist mask 105 includes a plurality of openings 105s positioned above the source trenches ST.

FIG. 9B is a schematic plan view showing a top surface of the resist mask 105. The openings 105s each have the planar shape same as the cross section of the FE 50 (see FIG. 1B).

Figure 10A:
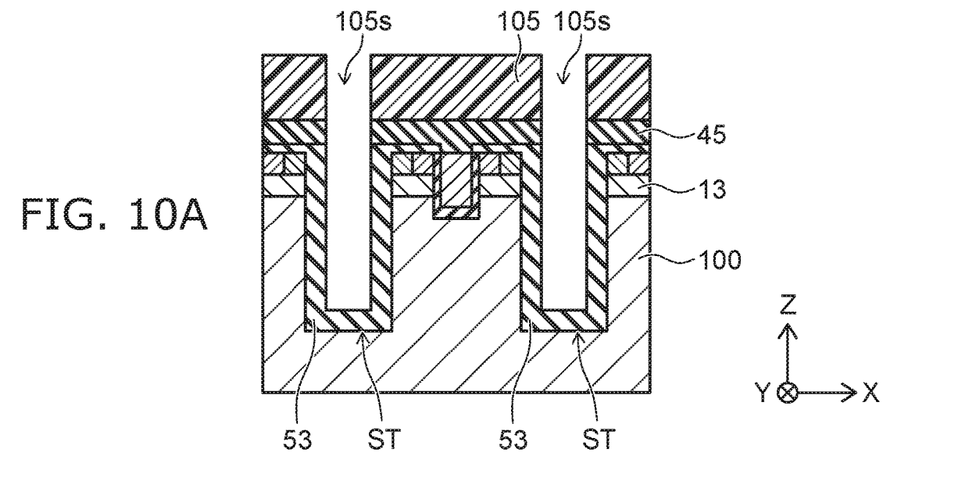

As shown in FIG. 10A, the interlayer insulating film 45 and the insulating film 103 are selectively removed using the resist mask 105. The interlayer insulating film 45 and the insulating film 103 are selectively removed by, for example, anisotropic RIE.

For example, when the insulating film 53 has a thickness thicker than a thickness of the second insulating portion 53b, a part of the insulating film 53 is selectively removed with the insulating film 103. When the insulating film 53 has the thickness equal to or less than the thickness of the second insulating portion 53b, the insulating film 103 is selectively removed. In this case, the second insulating portion 53b includes a part of the insulating film 103.

Figure 10B:
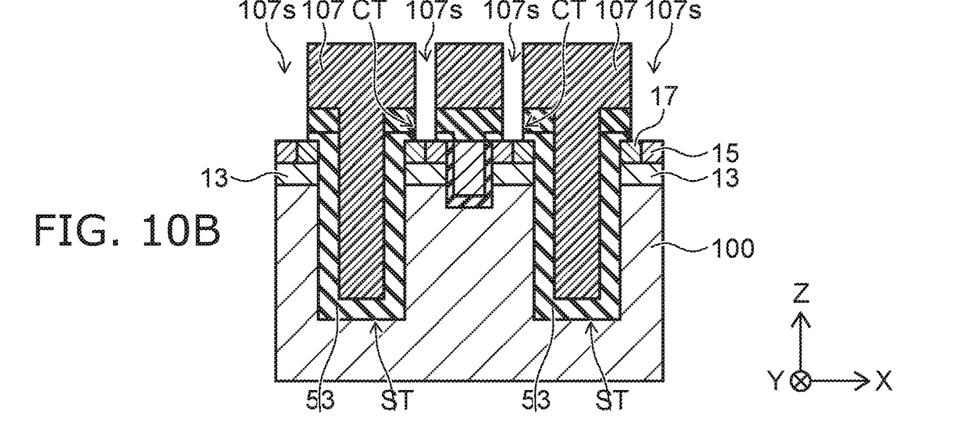

As shown in FIG. 10B, a resist mask 107 is formed to cover the interlayer insulating film 45. The resist mask 107 is formed after the resist mask 105 is removed. The resist mask 107 is formed to fill a space formed by removing the insulating film 103 (i.e., the source trench ST). The resist mask 107 includes an opening 107s provided above the n-type source layer 15 and the p-type contact layer 17.

Then, the interlayer insulating film 45 is selectively removed through the opening 107s to form a contact trench CT. The surface of n-type source layer 15 and the surface of p-type contact layer 17 are exposed at the bottom of the contact trench CT.

Figure 10C:
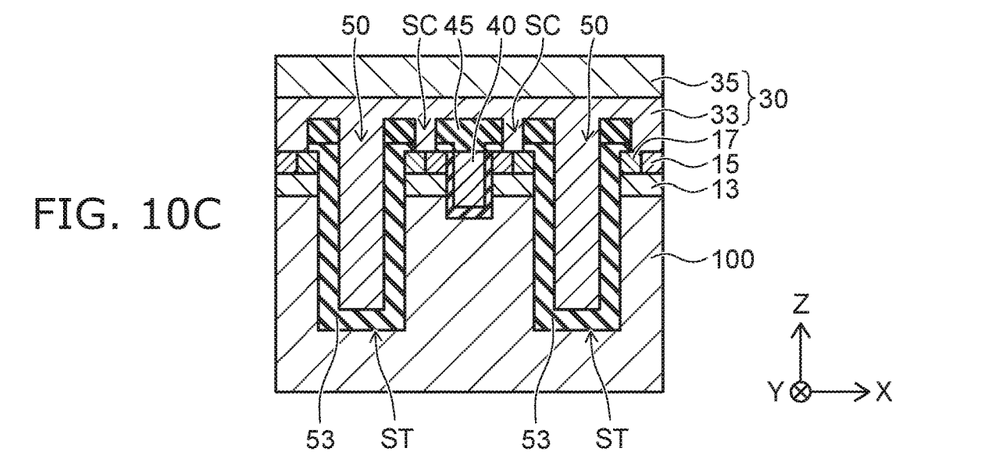

As shown in FIG, 10C, the source electrode 30 is formed on the interlayer insulating film 45. The source electrode 30 is formed after the resist mask 107 is removed. The source electrode 30 includes a buried layer 33 and a bonding layer 35.

The buried layer 33 is formed to fill the contact trench CT and the source trench ST. The buried layer 33 is, for example, a tungsten layer formed by CVD. The buried layer 33 may have a structure in which, for example, titanium (Ti), titanium nitride (TiN), and tungsten (W) are sequentially stacked.

The buried layer 33 includes the portion filling the contact trench CT, which is a source contact SC. The source contact SC is in contact with the n-type source layer 15 and the p-type contact layer 17, and electrically connected thereto. The buried layer 33 includes another portion filling the source trench ST, which is the FE 50.

Further, the bonding layer 35 is formed on the buried layer 33. The bonding layer 35 is, for example, an aluminum layer formed by a sputtering method. The source electrode 30 including the buried layer 33 and the bonding layer 35 is electrically connected to the n-type source layer 15, and electrically connected to the p-type diffusion layer via the p-type contact layer 17.

Then, At the back-surface side of the n-type semiconductor layer 100, the semiconductor substrate (or wafer) is thinned using, for example, grinding or polishing, and then the n-type drain layer 19 and the drain electrode 20 are formed (FIG. 1A) at the back-surface side. The n-type semiconductor layer 100 is the n-type drift layer 11 after the n-type drain layer 19 is formed at the back-surface side.

Figure 11A:
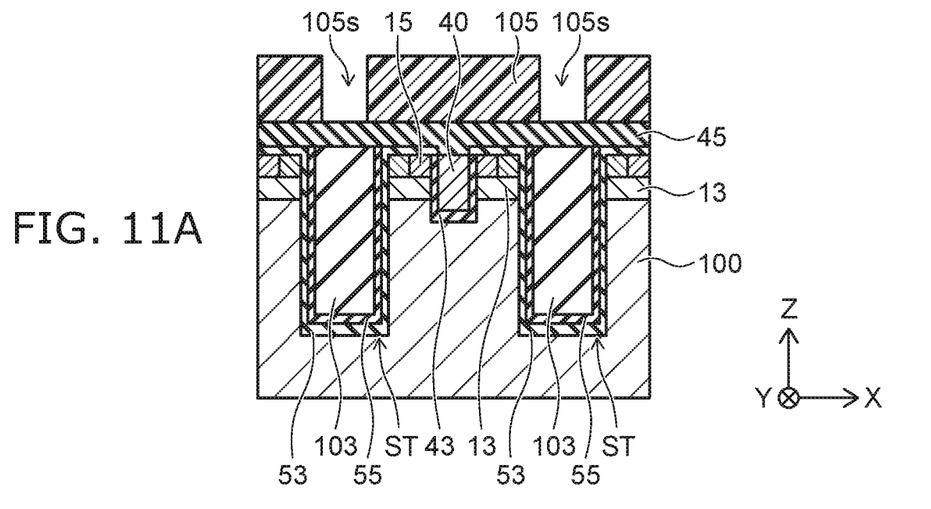
FIGS. 11A and 11B are schematic views showing a manufacturing process of the semiconductor device according to a modification of the embodiment.
Figure 11B:
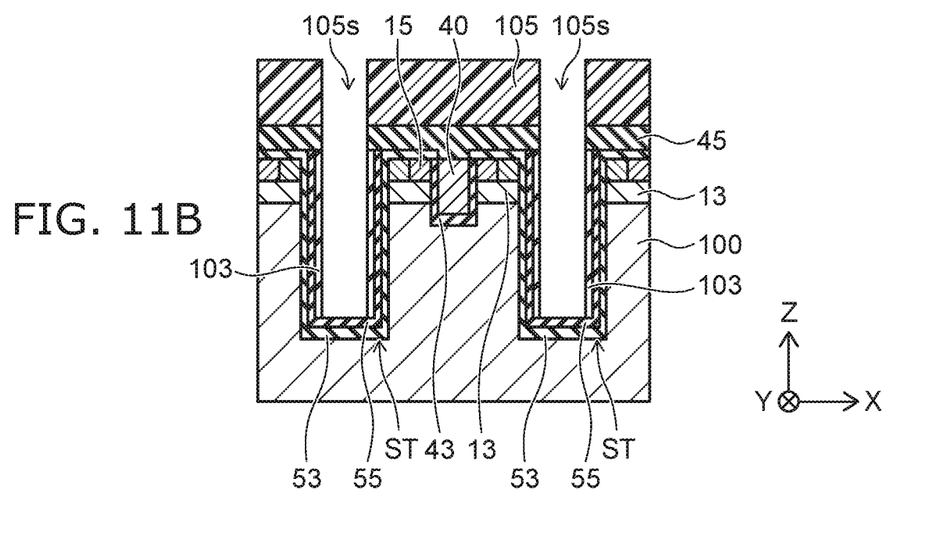

FIGS. 11A and 11B are schematic views showing a manufacturing process of the semiconductor device according to a modification of the embodiment. The manufacturing steps shown in FIGS. 11A and 11B are performed in place of the manufacturing steps shown in FIGS. 9A and 10A.

As shown in FIG. 11A, an insulating film 55 and the insulating film 103 are formed inside the source trench ST. After the insulating film 53 is formed, the insulating film 55 is formed by, for example, CVD (see FIG. 6B). The insulating film 55 is, for example, a silicon nitride film which is provided between the insulating film 53 and the insulating film 103.

As shown in FIG. 11B, the insulating film 103 is selectively removed through the openings 105s of the resist mask 105. Then, the insulating film 55 serves as the etching stop layer. In other words, the insulating film 55 prevents the insulating film 53 from being etched together with the insulating film 103 so that a space not reaching the n-type semiconductor layer 100 is formed.

The insulating film 55 is exposed at, for example, the bottom of the space after the insulating film 103 is removed. The insulating film 103 is etched, for example, leaving the portions thereof so that the portions thereof remains on the inner wall of the source trench ST. After the insulating film 103 is removed, for example, the insulating film 55 is exposed to a space in which the protrusion 50p is buried, and the insulating film 103 remains as the first insulating portion 53a (see FIG. 1B).

Figure 12A:
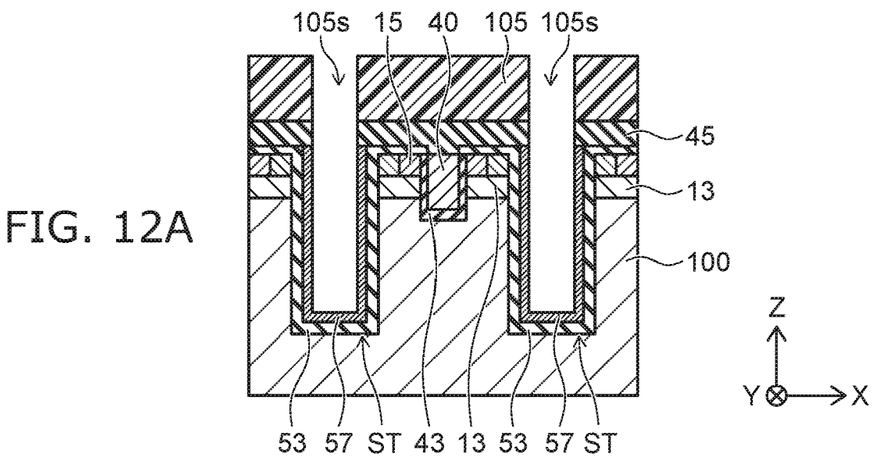
FIG. 12A to 12C are schematic views showing a manufacturing process of the semiconductor device according to another modification of the embodiment.
Figure 12B:
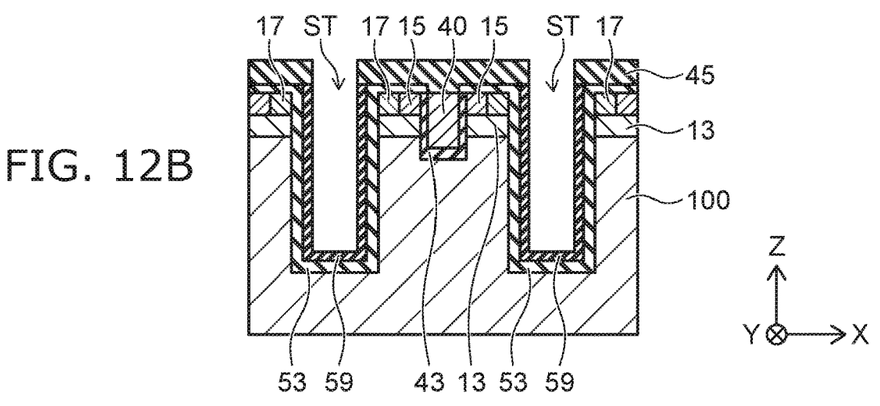
Figure 12C:
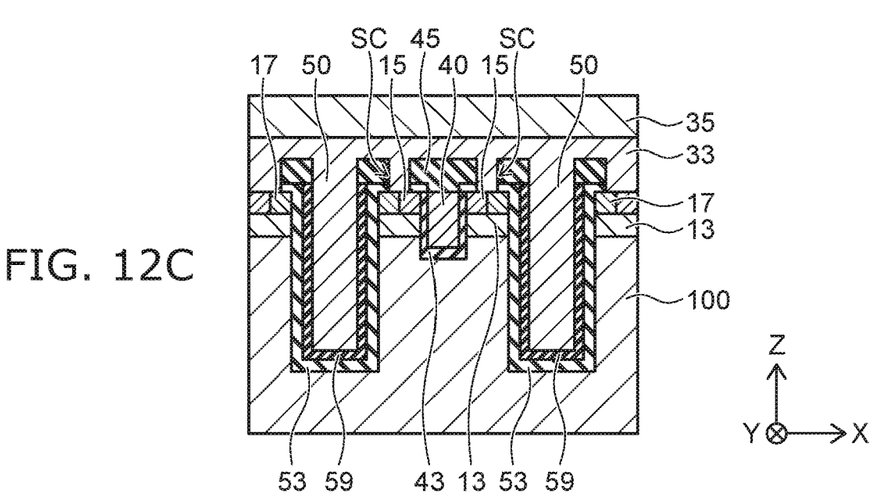

FIGS. 12A to 12C are schematic views showing a manufacturing process of the semiconductor device according to other modification of the embodiment. The manufacturing steps shown in FIGS. 12A to 12C are performed in place of the manufacturing steps shown in FIGS. 11A and 11B. In this example, a polysilicon film 57 is formed in place of the insulating film 55. After the insulating film 53 is formed, the polysilicon film 57 is formed by, for example, CVD (see FIG. 6B).

As shown in FIG. 12A, the insulating film 103 is selectively removed through the openings 105s of the resist mask 105. Then, the polysilicon film 57 serves as the etching stop layer for preventing the insulating film 53 from being etched. Although not shown in FIG. 12A, the portions of the insulating film 103, for example, remains on the polysilicon film 57 on the inner wall of the source trench ST (see FIG. 11B).

As shown in FIG, 12B, the polysilicon film 57 is converted into an insulating film 59. The insulating film 59 is, for example, a silicon oxide film which is formed by thermally oxidizing the polysilicon film 57.

Then, the source electrode 30 is formed after the contact trench CT is formed by selectively removing the interlayer insulating film 45 (see FIG. 10B). As shown in FIG. 12C, the source electrode 30 includes the buried layer 33 and the bonding layer 35.

It should be noted that the insulating film 59 is not limited to the silicon oxide film, and may be, for example, a silicon nitride film. The method of converting the polysilicon film 57 into the insulating film 59 is not limited to thermal oxidation, and may be, for example, a plasma oxidation method or a plasma nitridation method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor part including a first semiconductor layer of a first conductivity type, the semiconductor part having a first trench and a plurality of second trenches, the first trench and the plurality of second trenches being provided at a front surface side of the semiconductor part, the first trench and the plurality of second trenches extending into the first semiconductor layer;
    a first electrode provided on the front surface of the semiconductor part;
    a control electrode provided between the semiconductor part and the first electrode, the control electrode being provided inside the first trench, the control electrode being electrically isolated from the semiconductor part by a first insulating film, the control electrode being electrically isolated from the first electrode by a second insulating film; and
    a plurality of second electrodes provided between the semiconductor part and the first electrode, the plurality of second electrodes provided inside the plurality of second trenches, respectively, the plurality of second electrodes each being electrically isolated from the semiconductor part by a third insulating film, the plurality of second electrode being electrically connected to the first electrode,
    the semiconductor part further including a second semiconductor layer of a second conductivity type and a third semiconductor layer of the first conductivity type,
    the second semiconductor layer being provided between the first semiconductor layer and the first electrode, the second semiconductor layer facing the control electrode with the first insulating film interposed,
    the third semiconductor layer being selectively provided between the second semiconductor layer and the first electrode, the third semiconductor layer provided to contact the first insulating film, the third semiconductor layer being electrically connected to the first electrode,
    the plurality of second electrodes including first to third ones, the first and second ones of the second electrodes being adjacent to each other with a portion of the semiconductor part interposed,
    the third insulating film being provide between the first one of the second electrodes and the first semiconductor layer, the third insulating film including a first insulating portion and the second insulating portion, the second insulating portion being adjacent to the first insulating portion, the first insulating portion having a first thickness in a direction toward the first semiconductor layer from the first one of the second electrodes, the second insulating portion having a second thickness in a direction toward the first semiconductor layer from the first one of the second electrodes, the second thickness being thinner than the first thickness,
    the first insulating portion being provided between the first and second ones of the second electrodes, the second insulating portion being provided between the first and third ones of the second electrodes.

2. The device according to claim 1, wherein the control electrode is provided between the first and second ones of the second electrodes.

3. The device according to claim 1, wherein the second electrodes each include a protrusion protruding toward the second insulating portion of the third insulating film.

4. The device according to claim 3, the protrusion protrudes toward a center in an arrangement of three second electrodes of the plurality of second electrodes, the three second electrode being closest to each other.

5. The device according to claim 1, wherein the second electrodes each are provided with a columnar shape extending in a depth direction of the second trench, and the first and second insulating portions of the third insulating film surround each of the second electrodes, the first and second insulating portions being arranged alternately around each of the second electrodes.

6. The device according to claim 3, wherein the second trenches each are provided with a hexagonal cross-section parallel to the front surface of the semiconductor part; and the protrusion protrudes toward one of six corners of the hexagonal cross-section.

7. The device according to claim 3, wherein the second trenches each are provided with a square cross-section parallel to the front surface of the semiconductor part, the protrusion protruding toward one of four corners of the square cross-section.

8. The device according to claim 7, wherein the second trenches are arranged along the front surface of the semiconductor part in first and second directions, the first direction being orthogonal to the second direction, and the protrusion in each of the second electrode protrudes toward a center in an arrangement of four second trenches of the second trenches, the four second trenches being closest to each other.

9. The device according to claim 7, wherein the second trenches are arranged along the front surface of the semiconductor part with a staggered arrangement.

10. The device according to claim 3, wherein the second trenches each are provided with a circular cross-section parallel to the front surface of the semiconductor part.

11. The device according to claim 10, wherein the second trenches are arranged along the front surface of the semiconductor part in first and second directions, the first direction being orthogonal to the second direction, and the protrusion in each of the second electrode protrudes toward a center in an arrangement of four second trenches of the second trenches, the four second trenches being closest to each other.

12. The device according to claim 10, wherein the second trenches are arranged along the front surface of the semiconductor part with a staggered arrangement.

* * * * *